United States Patent
Tani et al.

[11] Patent Number: 5,753,136
[45] Date of Patent: May 19, 1998

[54] PIEZOELECTRIC CERAMIC COMPOSITION

[75] Inventors: Takao Tani; Tsuguto Takeuchi; Hiroaki Makino; Nobuo Kamiya, all of Aichi, Japan

[73] Assignee: Kabushiki Kaisha Toyota Chuo Kenkyusho, Aichi-ken, Japan

[21] Appl. No.: 862,924

[22] Filed: May 27, 1997

[30] Foreign Application Priority Data

May 28, 1996 [JP] Japan ................. 8-133663

[51] Int. Cl.$^6$ .................. C04B 35/491; C04B 35/49
[52] U.S. Cl. .................. 252/62.9 PZ; 501/134
[58] Field of Search .................. 252/62.9 PZ; 501/134

[56] References Cited

U.S. PATENT DOCUMENTS

| 5,188,992 | 2/1993 | Nishimura et al. | 501/136 |
| 5,345,139 | 9/1994 | Gururaja et al. | 310/358 |

FOREIGN PATENT DOCUMENTS

| 64-14172 | 1/1989 | Japan . |
| 5-845 | 1/1993 | Japan . |
| 7-277820 | 10/1995 | Japan . |

*Primary Examiner*—Melissa Bonner
*Attorney, Agent, or Firm*—Oblon, Spivak, McClelland, Maier & Neustadt, P. C.

[57] ABSTRACT

This invention provides a piezoelectric ceramic composition having large field-induced strain under high compressive stress, small temperature dependence of strain, and high energy conversion efficiency even at high temperatures. The composition is represented by;

$$(Pb_{1-(3X/2)-(U/2)}La_X)((Zr_YTi_{1-Y})_{1-Z-U}(Mg_{1/3}Nb_{2/3})_ZNb_U)O_3$$

where $0<X<2/3$; $0<U<1$; $0.53-(Z/3) \leq Y \leq 0.56-(Z/3)$; and $0.02 \leq Z \leq 0.10$. In this composition, a part of the crystals of PZT has been substituted by La and Nb and further by a suitable amount of PMN. These substituents play complementary roles to each other to impart aforementioned excellent properties to the ceramic composition.

5 Claims, 1 Drawing Sheet

PIEZOELECTRIC CERAMIC COMPOSITION

BACKGROUND OF THE INVENTION

1. Field of the Invention

The present invention relates to piezoelectric ceramic compositions usable as piezoelectric devices such as piezoelectric actuators for cars, etc.

2. Description of the Related Art

As piezoelectric ceramic compositions to be used for piezoelectric devices, known are ceramics comprising lead zirconate titanate ($PbTiO_3$/$PbZrO_3$-based solid solutions). Lead zirconate titanate will be referred to as "PZT" hereinafter. Such PZT-based ceramics have excellent piezoelectric properties, and are used widely, for example, in piezoelectric actuators, piezoelectric ignition devices, piezoelectric buzzers and filters, as electromechanical converter elements therein.

Where such PZT ceramics are used in piezoelectric actuators, for example, in electrically-controlled hydraulic valves in cars, they are required to have a large field-induced strain under high compressive stress and to have a stable field-induced strain in a wide temperature range. That is, the field-induced strain of the PZT ceramics should be less dependent on temperature. It has already been confirmed that the temperature dependence of the field-induced strain of such a PZT ceramic material qualitatively corresponds to the temperature dependence of the dielectric constant thereof. Therefore, the temperature dependence of the dielectric constant of the PZT ceramic material may be the criterion for the temperature dependence of strain of the material. In addition, piezoelectric actuators comprising such PZT ceramic materials are required to have high energy conversion efficiency even at high temperatures. For their energy conversion efficiency, their electromechanical coupling factor (Kp) may be the criterion.

Concretely, PZT ceramics for piezoelectric actuators are required to satisfy the following three requirements: (1) Their field-induced strain is not smaller than 0.070% under compressive stress of 20 MPa at room temperature when an electric field of from −0.4 to +1.2 kV/mm is applied; (2) TD value is not larger than 150%. TD value herein means the temperature dependence of their dielectric constant $\epsilon$ which is obtained according to the following equation.

$$TD\ value(\%)=(\epsilon_{max}-\epsilon_{min})/(\epsilon_{min})\times 100$$

where;

$\epsilon_{max}$ is the maximum value of $\epsilon^T_{33}$ at from −30° to 150° C.; and $\epsilon_{min}$ is the minimum value of $\epsilon^T_{33}$ at from −30° to 150° C. Here, −30° C. and 150° C. define a temperature range within which car parts shall be actually used; and (3) their electromechanical coupling factor (Kp) at 150° C. is not smaller than 55%.

Recently, it has been clarified that the above-mentioned piezoelectric properties of piezoelectric ceramics greatly depend on the type and the composition of metal elements constituting the piezoelectric ceramics. For example, Japanese Patent Application Laid-Open No. 64-14172 discloses PZT-based piezoelectric ceramic materials in which a part of PZT has been substituted by La and lead magnesium niobate ($Pb(Mg_{1/3}Nb_{2/3})O_3$). Lead magnesium niobate will be referred to as "PMN" hereinafter. Though having large field-induced strain, these have disadvantages of large temperature dependence of strain. Japanese Patent Application Laid-Open No. 5-845 discloses PZT-based piezoelectric ceramic materials in which a part of PZT crystals have been substituted by La and Nb. However, these have disadvantages of small field-induced strain. Japanese Patent Application Laid-Open No. 7-277820 discloses PZT-based piezoelectric ceramic materials in which a part of PZT crystals have been substituted by Nb and PMN. These also have disadvantages of small field-induced strain.

SUMMARY OF THE INVENTION

The present invention has been made in consideration of the above-mentioned situation, and its object is to provide piezoelectric ceramic compositions having large field-induced strain under high compressive stress, small temperature dependence of strain, and high energy conversion efficiency even at high temperatures.

We, the present inventors have further substituted a suitable amount of PMN for La,Nb-substituted PZT ceramics in which a part of PZT crystals was substituted by La and Nb, and, as a result, have found piezoelectric ceramic compositions which overcome the disadvantages of the above-mentioned conventional ones. On the basis of this finding, we have completed the present invention.

Specifically, the present invention provides a piezoelectric ceramic composition to be represented by a general formula:

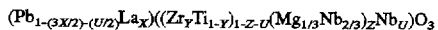

where;

$0<X<2/3$ $0<U<1$ $0.02 \leq Z \leq 0.10$ $0.53-(Z/3) \leq Y \leq 0.56-(Z/3)$.

The piezoelectric ceramic composition of the present invention comprises a PZT-based oxide, in which a part of the A site of the perovskite structure ($ABO_3$) of PZT has been substituted by La and a part of the B site thereof by Nb and PMN.

La, Nb and PMN are all substituents having the ability to improve the field-induced strain of PZT. The detailed mechanisms of the substituents, including the origin of their effect, have not been clarified yet, but it is known that the substituents have different effects on the properties of PZT.

La and Nb are both donors (ions having a higher valence than that of the ions at the corresponding site to be substituted). La has a good ability to improve the field-induced strain of the ceramics but increases the temperature dependence of strain of the ceramics. Nb has smaller effect in improving the field-induced strain than the other two substituents, but has larger effect in decreasing the temperature dependence of strain than the other two. Therefore, the substitution by La only in the ceramics is unsatisfactory for decreasing the temperature dependence of strain of the ceramics, while the substitution by Nb only therein is unsatisfactory for improving the field-induced strain of the ceramics.

Accordingly, in order to decrease the temperature dependence of strain as well as to improve the field-induced strain, the ceramics must be substituted by both La and Nb.

However, if the ceramics are substituted by only two of La and Nb, the amount of substitution is limited because of precipitation of any secondary phase in the ceramics, resulting in the unsatisfactory amount of strain. Given the situation, it has been clarified according to the present invention that further substitution by PMN can increase the strain. Further, the substitution by a suitable amount of PMN has compensated for the disadvantages of the other substituents without interfering with the advantages thereof, thereby improving the three properties of the ceramic compositions, that is, their field-induced strain, stability of characteristics, and energy conversion efficiency at high temperatures.

The degree of substitution by PMN (Z) shall be $0.02 \leq Z \leq 0.10$. If z is smaller than 0.02, the improvement in the field-induced strain is small. On the contrary, if Z is larger than 0.10, the decrease in Kp at high temperatures is too large. More preferably, from the viewpoint of the temperature dependence of strain and the energy conversion efficiency, the degree of substitution by PMN shall be $0.02 \leq Z \leq 0.08$, within which the TD value is not larger than 100% and Kp at 150° C. is not smaller than 60%.

The piezoelectric properties of PZT greatly depend on the ratio of Zr/Ti represented by the value Y. Therefore, the value Y is also an important factor to determine the piezoelectric properties of the piezoelectric ceramic composition of the present invention. The substitution by PMN in La,Nb-substituted PZT changes the crystal structure of the resulting PZT. The PMN substitution to the degree of 0.03 in terms of Z causes the crystal structure changes almost as large as those caused by the reduction of Y by 0.01. Accordingly, in order to determine the optimum value of Y, the factor, $-(Z/3)$ should be taken into consideration. When Y satisfies the condition of $0.53-(Z/3) \leq Y \leq 0.56-(Z/3)$, the both properties, field-induced strain and temperature dependence of strain are favorably satisfactory. If Y is smaller than $0.53-(Z/3)$, the field-induced strain is insufficient; while if Y is larger than $0.56-(Z/3)$, the temperature dependence of strain is unfavorably large.

Especially desirably, the degree of substitution by La (X) is 0.02 or more and that by Nb (U) is 0.02 or more, as producing better results. If, however, the sum of the degrees of substitution by La and Nb is larger than 0.06, the amount of cation defects resulting from the donor substitution exceeds the critical value, thereby causing the precipitation of a secondary phase (pyrochlore phase). This secondary phase restrains the movement of the domain walls, thereby decreasing the field-induced strain. Accordingly, it is desirable that the degree of substitution by La and that by Nb satisfy the condition of $X+U \leq 0.06$.

Addition of a small amount of Mn to the ceramics lowers the dielectric loss of the resulting ceramics, while maintaining the field-induced strain and the temperature dependence of strain. The dielectric loss should preferably low because it generates heat during driving of actuators. Therefore, the addition of a small amount of Mn is effective for use of the ceramics in actuators. However, if the amount of Mn added is larger than 0.5 mol %, the field-induced strain decreases too much. Accordingly, the amount of Mn to be added is desirably not larger than 0.5 mol %. The addition of 0.5 mol % of Mn corresponds to the addition of 0.137 wt. % of $MnO_2$. Here, mol % and wt. % are based on the total amount of the substituted PZT.

The piezoelectric ceramic composition of the present invention has large field-induced strain under high compressive stress, small temperature dependence of strain, and high energy conversion efficiency even at high temperatures. Thus, since the piezoelectric ceramic composition of the invention has such excellent piezoelectric properties, it can be suitably utilized as piezoelectric devices that are usable in, for example, actuators for cars.

DETAILED DESCRIPTION OF THE INVENTION

Figure 1:
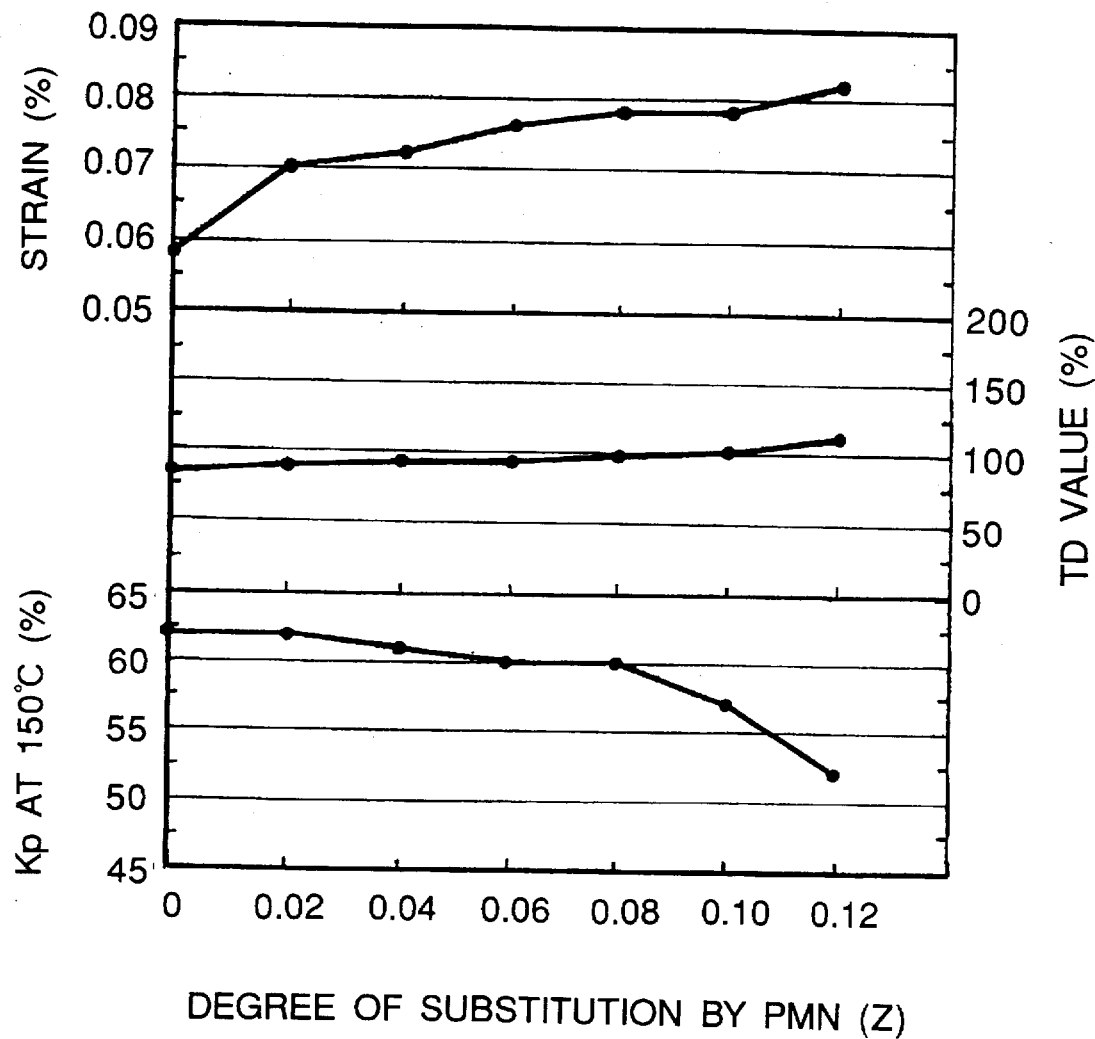
FIG. 1 is a graph showing the field-induced strain, the TD value, and the variation in Kp at 150° C. of the piezoelectric ceramic composition with X=0.03 and U=0.03 as prepared in Example 1 mentioned below.

The method for producing the piezoelectric ceramic composition of the present invention is not specifically defined, and any ordinary process of producing ordinary ceramics may be applied. For example, powders of high-purity raw materials for the piezoelectric ceramic composition, such as PbO, $La_2O_3$, $ZrO_2$, $TiO_2$, $Nb_2O_5$, MgO and $MnO_2$, are weighed, mixed, calcinated and pulverized to prepare a powdery mixture. Then, the mixture is shaped into piezoelectric ceramics by pressing or the like means, and the shaped bodies are sintered.

When the shaped bodies are sintered, it is desirable that the shaped body is completely embedded into a powder having the same composition with the piezoelectric ceramic composition, in order to prevent the change in the composition of the body. In that manner, the evaporation of Pb and other components during the sintering can be prevented, and thus the change in the composition in the sintered body can be prevented. If, however, the composition of the shaped body is different from that of the powder, the substances constituting the both may move into each other, so that it is difficult to obtain the sintered body having the same composition with that of the starting materials as mixed.

The sintering temperature is desirably between 1000° C. and 1300° C. If it is lower than 1000° C., dense sintered bodies are difficult to obtain; but if it is higher than 1300° C., too much Pb evaporates, making it more likely to change the composition.

It is further desirable that the shaped bodies are sintered in an oxygen stream or in an oxygen atmosphere at from 1000° C. to 1300° C., whereby sintered piezoelectric ceramic compositions having excellent field-induced strain can be obtained. This is considered because the promoted densification may reduce pores to be formed in the sintered ceramics and because the decrease in the oxygen defects in the sintered ceramics may facilitate the movement of the domain walls therein. During the sintering process, it is further desirable that the furnace is once degassed into vacuum and thereafter oxygen is introduced, whereby sintered piezoelectric ceramic compositions having much more excellent field-induced strain can be obtained.

The piezoelectric ceramic composition of the present invention is characterized in that a part of the PZT crystals have been substituted by La and Nb and that said La,Nb-substituted PZT has been further substituted by a predetermined amount of PMN.

The substituents La, Nb and PMN all have the ability to improve the field-induced strain in PZT, but their behavior differs individually. La has a great ability to improve the strain, but increases the temperature dependence of strain. The ability of Nb to improve the strain is lower than that of the other two, but Nb has an ability to decrease the temperature dependence of strain. PMN has a great ability to improve the strain, but too much substitution by PMN causes a significant decrease in Kp at high temperatures.

However, the substitution by La and Nb only could not produce satisfactory improvement in the strain. This is because the degrees of the substitution by these shall be limited, since the substitution by too much La and Nb causes the precipitation of a secondary phase. The substitution by La and PMN only could produce satisfactory improvement in the strain, but unfavorably increases the temperature dependence of strain. Regarding the substitution by Nb and PMN only, if the degree of substitution by PMN is too small, such could not produce satisfactory improvement in the strain, but, on the contrary, if the degree of substitution by PMN is increased in order to attain satisfactory improvement in the strain, Kp at high temperatures is greatly lowered.

For these reasons, in the present invention, PZT is partly substituted by La and Nb and further by a well-balanced amount of PMN, whereby those substituents can compensate for their disadvantages without interfering with their advantages. Thus, the piezoelectric ceramic composition of the present invention can satisfy all the contradictory three properties, that is, large filed-induced strain, small temperature dependence of strain and high energy conversion efficiency at high temperatures. Accordingly, the piezoelectric ceramic composition of the present invention is characterized by its excellent properties such that it has a field-induced strain of not smaller than 0.070% under compressive stress of 20 MPa at room temperature when an electric field of from −0.4 to +1.2 kV/mm is applied; that its TD value within a temperature range between −30° C. and 150° C. is not larger than 150%; and that its electromechanical coupling factor (Kp) at 150° C. is not smaller than 55%.

If a small amount of Mn is added to PZT which is substituted by La and Nb and further by a suitable amount of PMN, the dielectric loss of the Mn-added piezoelectric ceramic composition is lowered while the crystal structure, the field-induced strain and the temperature dependence of the Mn-added composition are still kept to be comparable to those of the piezoelectric ceramic composition with no Mn added thereto.

Now, the present invention will be described more concretely with reference to the following Examples.

EXAMPLE 1

In this Example 1, prepared were seven specimens, Nos. 1 to 7, of piezoelectric ceramic compositions as shown in Table 1, and their properties were evaluated. In Table 1, "the Invention" means that this is a specimen of the present invention; while "Comparison" means that this is a comparative specimen. (The same shall apply to the other Tables to be mentioned hereinunder.)

As the starting materials, prepared herein were oxide powders of PbO, $La_2O_3$, $ZrO_2$, $TiO_2$, $Nb_2O_5$, and MgO. Predetermined amounts of these were weighed to give samples of a compositional formula, $(Pb_{1-(3X/2)-(U/2)}La_X)((Zr_YTi_{1-Y})_{1-Z-U}(Mg_{1/3}Nb_{2/3})_ZNb_U)O_3$ in which U=0.03, X=0.03, Z was varied to 0.00, 0.02, 0.04, 0.06, 0.08, 0.10 and 0.12, and Y was varied to 0.540, 0.533, 0.527, 0.520, 0.513, 0.507 and 0.500 corresponding to the previous Z, and fully dry-blended to obtain seven powdery mixtures.

These mixtures were separately sheathed in an MgO sheath, calcinated at from 700° to 900° C. for from 1 to 10 hours, and then ball-milled with $ZrO_2$ balls and ethanol in a bottle for from 8 to 72 hours to obtain slurries. These slurries were separately dried, ground, die-pressed at 39 MPa and then cold isostatic-pressed at 294 MPa to obtain disc pellets each having a diameter of about 15 mm and a thickness of about 2 mm. These pellets were separately embedded into a powder having the same composition with that of the respective pellet, sheathed in an aluminum sheath, and calcinated in air at from 1000° C. to 1300° C. for from 2 to 4 hours. Thus were obtained piezoelectric ceramic pellet specimens.

After having been polished, the both surfaces of each pellet specimen was coated with Au, using an ion coater, to form an Au electrode thereon. Next, these were polarized in an insulating oil at from 80° to 150° C. For this polarization, an electric field of from 1 to 5 kV/mm was applied to the pellet specimens for from 5 to 60 minutes. Thus were prepared specimens, of which the properties were evaluated according to the methods mentioned below.

Using a micro-strain measuring device which can accurately measure the strain (1 μm or less) of a single pellet under high compressive stress, the field-induced strain in each specimen was measured. The strain (%) in each specimen was measured in air at room temperature and under a compressive stress of 20 MPa, while an electric field of from −0.4 to +1.2 kV/mm was applied.

Using a system comprising a vector impedance analyzer (HP 4194A) and an environmental chamber (Tabai Espec PL-1F), the dielectric constant ($\epsilon^T_{33}$) of each specimen at from −30° to 150° C. was measured. From the thus-measured dielectric constant values, the TD value (%) of each specimen was obtained.

Further using the same system, the electromechanical coupling factor Kp (%) of each specimen at 150° C. was measured. Table 1 shows the values of X, Y, Z and U of the specimens, along with their strain, TD value, and Kp at 150° C. In FIG. 1, the uppermost graph shows the strain with respect to the degree of substitution by PMN (Z); the middle graph shows the TD value with respect to the same; and the lowermost graph shows the Kp value at 150° C. with respect to the same.

TABLE 1

| | X | Y | Z | U | Strain (%) | TD value (%) | Kp at 150° C. (%) |
|---|---|---|---|---|---|---|---|
| 1 Comparison | 0.03 | 0.540 | 0.00 | 0.03 | <u>0.058</u> | 84 | 62 |
| 2 the Invention | 0.03 | 0.533 | 0.02 | 0.03 | 0.070 | 90 | 62 |
| 3 the Invention | 0.03 | 0.527 | 0.04 | 0.03 | 0.072 | 93 | 61 |
| 4 the Invention | 0.03 | 0.520 | 0.06 | 0.03 | 0.076 | 94 | 60 |
| 5 the Invention | 0.03 | 0.513 | 0.08 | 0.03 | 0.078 | 98 | 60 |
| 6 the Invention | 0.03 | 0.507 | 0.10 | 0.03 | 0.078 | 101 | 57 |
| 7 Comparison | 0.03 | 0.500 | 0.12 | 0.03 | 0.082 | 110 | <u>52</u> |

Table 1 and FIG. 1 show that the specimens Nos. 2 to 6 with Z falling between 0.02 and 0.10 have a strain of not smaller than 0.070%, a TD value of not larger than 150% and a Kp value at 150° C. of not smaller than 55%. In particular, it is known that the specimens Nos. 2 to 5 with Z falling between 0.02 and 0.08 (0.02≦Z≦0.08) have a TD value of not larger than 100% and a Kp value at 150° C. of not smaller than 60%. As opposed to these, it is known that the specimen No. 1 not substituted by PMN with Z=0 has a small strain, while the specimen No. 7 with Z of larger than 0.10 has a low Kp value at 150° C.

From these results, it is understood that the piezoelectric ceramic compositions having a degree of substitution by PMN (Z) of falling between 0.02 and 0.10 have excellent properties. In particular, those with Z of falling between 0.02 and 0.08 (0.02≦Z≦0.08) have extremely excellent properties.

EXAMPLE 2

In this Example 2, prepared were ten specimens, Nos. 8 to 17, of piezoelectric ceramic compositions each having a different ratio of Zr/Ti, as shown in Table 2, and their properties were evaluated. Ten specimens Nos. 8 to 17 were prepared in the same manner as in Example 1, except that predetermined amounts of powdery raw materials were weighed to give specimens of a compositional formula, $(Pb_{1-(3X/2)-(U/2)}La_X)((Zr_YTi_{1-Y})_{1-Z-U}(Mg_{1/3}Nb_{2/3})_ZNb_U)O_3$ in which Z=0.04 while Y was varied to 0.507, 0.517, 0.537, 0.547 and 0.557; or Z=0.06 while Y was varied to 0.500, 0.510, 0.530, 0.540 and 0.550. Table 2 shows the values of X, Y, Z and U of the specimens, along with the data of their strain, TD value and Kp at 150° C. as measured herein. To satisfy the condition of 0.53–(Z/3)≤Y≤0.56–(Z/3), Y must be 0.517≤Y≤0.547 when Z=0.04, or must be 0.510≤Y≤0.540 when Z=0.06.

TABLE 2

| | X | Y | Z | U | Strain (%) | TD value (%) | Kp at 150° C. (%) |
|---|---|---|---|---|---|---|---|
| 8 Comparison | 0.03 | 0.507 | 0.04 | 0.03 | 0.064 | 82 | 60 |
| 9 Comparison | 0.03 | 0.500 | 0.06 | 0.03 | 0.064 | 80 | 58 |
| 10 the Invention | 0.03 | 0.517 | 0.04 | 0.03 | 0.070 | 88 | 60 |
| 11 the Invention | 0.03 | 0.510 | 0.06 | 0.03 | 0.072 | 90 | 59 |
| 12 the Invention | 0.03 | 0.537 | 0.04 | 0.03 | 0.076 | 113 | 62 |
| 13 the Invention | 0.03 | 0.530 | 0.06 | 0.03 | 0.078 | 120 | 62 |
| 14 the Invention | 0.03 | 0.547 | 0.04 | 0.03 | 0.074 | 143 | 59 |
| 15 the Invention | 0.03 | 0.540 | 0.06 | 0.03 | 0.074 | 149 | 58 |
| 16 Comparison | 0.03 | 0.557 | 0.04 | 0.03 | 0.082 | 185 | 56 |
| 17 Comparison | 0.03 | 0.550 | 0.06 | 0.03 | 0.082 | 191 | 54 |

Table 2 shows that the specimens Nos. 10 to 15 with Y satisfying 0.53–(Z/3)≤Y≤0.56–(Z/3) have a strain of not smaller than 0.070%, a TD value of not larger than 150% and a Kp value at 150° C. of not smaller than 55%. As opposed to these, it is known that the specimens No. 8 and No. 9 with Y of smaller than 0.53–(Z/3) have a small TD value of about 80% and therefore have small temperature dependence of strain, but these specimens have a small strain of 0.064%. On the other hand, it is known that the specimens Nos. 16 and 17 with Y of larger than 0.56–(Z/3) both have a large strain of 0.082% but have a TD value of larger than 180%. Thus, these specimens, Nos. 16 and 17 have large temperature dependence of strain.

From these results, it is understood that the piezoelectric ceramic compositions with Y satisfying 0.53–(Z/3)≤Y≤0.56–(Z/3) have excellent properties.

EXAMPLE 3

In this Example 3, prepared were eight specimens, Nos. 18 to 25, of piezoelectric ceramic compositions each having a different degrees of substitution by La and Nb, as shown in Table 3, and their properties were evaluated. The eight specimens Nos. 18 to 25 were prepared in the same manner as in Example 1, except that predetermined amounts of powdery raw materials were weighed to give four specimens of a compositional formula, $(Pb_{1-(3X/2)-(U/2)}La_X)((Zr_YTi_{1-Y})_{1-Z-U}(Mg_{1/3}Nb_{2/3})_ZNb_U)O_3$ in which Y=0.520, Z=0.06 and U=0.03, while X was varied to 0.00, 0.01, 0.02 and 0.04, and that predetermined amounts of powdery raw materials were weighed to give four other specimens of the same compositional formula in which X=0.03, Y=0.520 and Z=0.06 while U was varied to 0.00, 0.01, 0.02 and 0.04. Table 3 shows the values of X, Y, Z and U of the specimens, along with the data of their strain, TD value and Kp at 150° C. as measured herein.

TABLE 3

| | X | Y | Z | U | Strain (%) | TD value (%) | Kp at 150° C. (%) |
|---|---|---|---|---|---|---|---|
| 18 Comparison | 0.00 | 0.520 | 0.06 | 0.03 | 0.065 | 77 | 63 |
| 19 the Invention | 0.01 | 0.520 | 0.06 | 0.03 | 0.071 | 84 | 63 |
| 20 the Invention | 0.02 | 0.520 | 0.06 | 0.03 | 0.074 | 90 | 61 |
| 21 the Invention | 0.04 | 0.520 | 0.06 | 0.03 | 0.070 | 81 | 56 |
| 22 Comparison | 0.03 | 0.520 | 0.06 | 0.00 | 0.072 | 159 | 58 |
| 23 the Invention | 0.03 | 0.520 | 0.06 | 0.01 | 0.073 | 137 | 59 |
| 24 the Invention | 0.03 | 0.520 | 0.06 | 0.02 | 0.075 | 110 | 60 |
| 25 the Invention | 0.03 | 0.520 | 0.06 | 0.04 | 0.071 | 79 | 56 |

Table 3 shows that the specimens Nos. 18 and 22 containing either one of La and Nb have a small strain or have a large TD value, while the specimen Nos. 19, 20, 21, 23, 24 and 25 containing both La and Nb have a large strain and a small TD value. Thus, it is understood that the latter have excellent properties. In particular, it is known that the specimens Nos. 20 and 24 with X and U of 0.02≤X≤0.04 and 0.02≤U≤0.04 (provided that X+U≤0.06) have a strain of not smaller than 0.074% and have a Kp value at 150° C. of not smaller than 60%. Thus, it is understood that these samples have extremely excellent properties.

EXAMPLE 4

In this Example 4, prepared were specimens of Mn-containing piezoelectric ceramic compositions, using a powdery oxide of $MnO_2$. Two specimens Nos. 26 and 27 were prepared in the same manner as in Example 1, except that 0.25 mol % or 0.5 mol % of Mn was added to these. Table 4 shows the data of the strain, the TD value, the Kp at 150° C. and the dielectric loss of these specimens as measured herein, along with those of the comparative specimen, No. 4.

TABLE 4

| | Process | Strain (%) | TD value (%) | Kp at 150° C. (%) | Dielectric Loss (%) |
|---|---|---|---|---|---|
| 26 the Invention | 0.25 mol % of Mn added | 0.076 | 96 | 60 | 1.2 |
| 27 the Invention | 0.5 mol % of Mn added | 0.075 | 97 | 60 | 0.7 |
| 28 the Invention | Sintered in oxygen atmosphere | 0.082 | 90 | 62 | — |
| 4* the Invention | For Comparison | 0.076 | 94 | 60 | 2.4 |

*Note:
The specimens in Table 4 were compared with the specimen No. 4 (X = 0.03, Y = 0.520, Z = 0.06, U = 0.03) in Example 1.

Table 4 shows that the specimens Nos. 26 and 27 containing Mn of not larger than 0.5 mol % have, as compared with the specimen No. 4, a greatly lowered dielectric loss, while having a strain, a TD value and a Kp value at 150° C. nearly comparable to those of the specimen No. 4.

From these data, it is understood that the piezoelectric ceramic compositions containing Mn of not larger than 0.5 mol % have excellent properties.

EXAMPLE 5

A specimen No. 28 was prepared herein in the same manner as in the preparation of the specimen No. 4 in Example 1, except that the shaped body was sintered in an oxygen atmosphere. The strain, the TD value and the Kp value at 150° C. of the specimen No. 28 are shown in Table 4.

Table 4 shows that the specimen No. 28 as sintered in an oxygen atmosphere has, when compared with the specimen No. 4 as sintered in air, a somewhat lower TD value and has an increased strain and an increased Kp value at 150° C.

From these data, it is understood that the piezoelectric ceramic composition as sintered in an oxygen atmosphere has excellent properties.

While the invention has been described in detail and with reference to specific embodiments thereof, it will be apparent to one skilled in the art that various changes and modifications can be made therein without departing from the spirit and scope thereof.

What is claimed is:

1. A piezoelectric ceramic composition, comprising a compound of a general formula:

$$(Pb_{1-(3X/2)-(U/2)}La_X)((Zr_YTi_{1-Y})_{1-Z-U}(Mg_{1/3}Nb_{2/3})_ZNb_U)O_3$$

wherein $0<X<2/3$;

$0<U<1$;

$0.02 \leq Z \leq 0.10$; and $0.53-(Z/3) \leq Y \leq 0.56-(Z/3)$.

2. The piezoelectric ceramic composition as claimed in claim 1, wherein the X and the U in the formula are further defined by:

$0.02 \leq X \leq 0.04$;

$0.02 \leq U \leq 0.04$; and $X+U \leq 0.06$.

3. The piezoelectric ceramic composition as claimed in claim 1, further comprising Mn of not more than 0.5 mol %.

4. The piezoelectric ceramic composition as claimed in claim 1, wherein the Z in the formula is further defined by $0.02 \leq Z \leq 0.08$.

5. A piezoelectric ceramic composition, having a general formula of $(Pb_{1-(3X/2)-(U/2)}La_X)((Zr_YTi_{1-Y})_{1-Z-U}(Mg_{1/3}Nb_{2/3})_ZNb_U)O_3$ wherein $0<X<2/3$, $0<U<1$, $0.02 \leq Z \leq 0.10$, and $0.53-(Z/3) \leq Y \leq 0.56-(Z/3)$, being produced by a method comprising a step of calcinating a shaped body of raw material powders in an oxygen stream or in an oxygen atmosphere.

* * * * *